United States Patent [19]

Cluzel et al.

[11] 4,031,418

[45] June 21, 1977

[54] LOW FREQUENCY ACOUSTICAL PIEZO-ELECTRIC TRANSDUCER

[75] Inventors: Philippe Cluzel; Michel Quivy, both of Six-les-Fours-les Plages; Bernard Tocquet, Sanary, Mer, all of France

[73] Assignee: Etat Francais, Paris, France

[22] Filed: Sept. 3, 1975

[21] Appl. No.: 610,076

[30] Foreign Application Priority Data

Sept. 9, 1974 France ............................ 74.30415

[52] U.S. Cl. .................................... 310/8.2; 340/10

[51] Int. Cl.² .......................................... H01L 41/04

[58] Field of Search .............. 310/8.2, 8.7, 9.1, 9.4, 310/8.4; 340/10

[56] References Cited

UNITED STATES PATENTS

| | | | |
|---|---|---|---|
| 3,281,770 | 10/1966 | Sims | 340/10 X |
| 3,328,751 | 6/1967 | Massa | 340/10 |
| 3,421,139 | 1/1969 | Siebert | 340/10 |
| 3,686,115 | 8/1972 | Farman et al. | 340/10 X |
| 3,778,758 | 12/1973 | Carson | 310/8.2 X |

*Primary Examiner*—Mark O. Budd

[57] ABSTRACT

A piezo-electric transducer for low frequency acoustical waves comprising a stack of piezo-electric elements and alternating electrodes disposed between a front receiver plate and a counter mass. The countermass comprises a rigid annular block surrounding the stack, a rear plate engaging the rear of the stack and an elastic connection between the block and the rear plate.

8 Claims, 3 Drawing Figures

LOW FREQUENCY ACOUSTICAL PIEZO-ELECTRIC TRANSDUCER

FIELD OF THE INVENTION

The present invention relates to a piezo-electric transducer adapted to serve for reception or emission of acoustic waves of low frequency.

In particular, the technical field of the invention is that of the construction of emitting and receiving antennas for acoustical waves utilized under water.

BACKGROUND

Known are piezo-electric transducers of the Tonpilz type comprising a stack of piezo-electric elements alternating with electrodes, which stack is placed between, on the one hand, a front receiver plate whose external front face is the emittive or receptive face, and on the other hand, a countermass. These transducers are generally of a total length which is the order of one-half of the fundamental wavelength in the material constituting the transducer.

As a result, transducers of the Tonpilz type adapted for emitting or receiving acoustical waves of low frequency are of relatively large size. For example, a transducer for emitting acoustical waves having a frequency of 1300 Hz has a length of the order of one meter and antennas composed of a number of transducers of this type are very heavy and very cumbersome. On the other hand, the stack of piezo-electric elements and the countermass are generally placed in a sealed casing filled with air in order to avoid the emission of acoustical waves towards the rear and for obtaining transducers having a good intrinsic directivity. When the size of the stack and the casing are substantial, it becomes very difficult to obtain casings which resist the hydrostatic pressures due to immersion at great depths.

Attempts have been made to reduce the length of transducers of Tonpilz type for low frequency by utilizing countermasses of a very dense metal having a low mechanical stiffness, for example, tungsten. However, this solution does not permit reducing the length to a large degree and increases the weight.

SUMMARY OF THE INVENTION

An object of the present invention is to produce or to capture acoustical waves of low frequency with high yield by means of a transducer of reduced size and weight which can be immersed to great depths.

Another object of the invention is to provide a transducer for low frequency operation which is easily adjustable to a determined fundamental frequency without modifying the total length of the transducer.

A piezo-electric transducer according to the invention adapted to capture or emit acoustical waves of low frequency is constituted as a transducer of Tonpilz type composed of a stack of piezo-electric elements alternating with electrodes, said stack being placed between a receiver plate at the front and a countermass at the rear.

The objects of the invention are obtained by a construction in which the countermass is placed at least in part in front of the rear extremity of the stack of piezo-electric elements and therearound.

In a preferred embodiment, the countermass is composed of a rigid block in the form of a ring situated around the stack and an elastic connection means is provided between the block and the rear extremity of the stack.

The elastic connection means is preferably constituted by a tube containing the stack or by bolts.

The tube can be threaded externally and said ring can be constituted by a threaded nut on the tube such that it can be displaced longitudinally to permit adjustment of the fundamental frequency of the transducer.

The tube and the ring can form a casing in which the stack of piezo-electric elements is enclosed, said casing being closed in sealed manner at the front extremity by the receiver plate and at the rear extremity by a cover.

In one preferred embodiment, the ring of the countermass entirely surrounds the rear face of the receiver plate and is separated therefrom by a layer of air. The rear face of the receiver plate can have projections which engage in hollow recesses in the countermass.

The result of the invention is a novel product constituting an electro-acoustic transducer adapted to capture or emit acoustical wavelengths, preferably of low frequency, for example in the range between 500–5000 Hz.

A first advantage of this new transducer resides in a reduced weight and length with respect to transducers of given power of the same type adapted for the same frequency bands.

This reduction of weight and size permits utilization for constructing sonar antennas utilized in underwater acoustics, which can be immersed to very great depths due to the fact that one can realize much more simply sealed casings resistent to pressure with the dimensions of these casings being greatly reduced.

The presence of a tube of elastic material connecting the rigid block of the counter mass to the rear extremity of the stack permits, without increasing the total length, very substantial reduction of the fundamental frequency with respect to that of an apparatus of the same type whose countermass would be constituted of the same block placed at the rear of the stack. In fact, if the length of the tube and the elasticity thereof are of the same order of those of the stack, the presence of the tube permits the fundamental frequency to be divided by $\sqrt{2}$.

It can be still further reduced advantageously by utilizing a tube whose stiffness is less than that of the stack.

In the embodiment in which the countermass is formed by a threaded ring on an externally threaded tube, it is simple to vary the fundamental frequency over a relatively large band width, for example, from 1000Hz to 1500Hz according to the position for the ring on the tube. This embodiment serves particularly well for laboratory apparatus which can be utilized on different frequencies or for the realization of antennas which should be tuned with precision at a well determined frequency.

The transducers of Tonpilz type are generally transducers of ($\lambda/2$) whose total length is equal to a half wavelength.

As a result, the front face of the receiver plate and the rear face of the countermass vibrate substantially in opposite phase.

In order to obtain a good directivity, it is necessary to eliminate to a maximum the emissions or the receptions of other waves at the front face of the receiver plate.

When the operating assembly is enclosed in a casing, the outlet of which is soley at the front face of the receiver plate, the air contained in the casing produces acoustical decoupling of the parts of the vibrating assembly other than the front face of the receiver plate. However, it is difficult to construct sealed casings of large size resistant to the high hydrostatic pressures and to realize a good acoustical decoupling between the casing and the vibrating assembly.

One advantage of transducers according to the invention, is that the extremity of the countermass which is normally placed remote from the receiver plate is now placed adjacent the receiver plate. Thus the transducer can be constructed such that the countermass entirely envelopes the rear face of the receiver plate while being separated therefrom by a layer of air such that the countermass intercepts the vibrations coming from the rear face of the receiver plate where it would be captured thereby. This acoustical insulation effect at the rear face of the receiver plate is accentuated by the fact that the two surfaces on opposite sides of the intermediate air layer vibrate substantially in opposite phase to permit attentuation of the rays towards the rear.

The following description refers to the annexed drawings which show embodiments of the example by way of non-limitative example.

DETAILED DESCRIPTION

Figure 1:
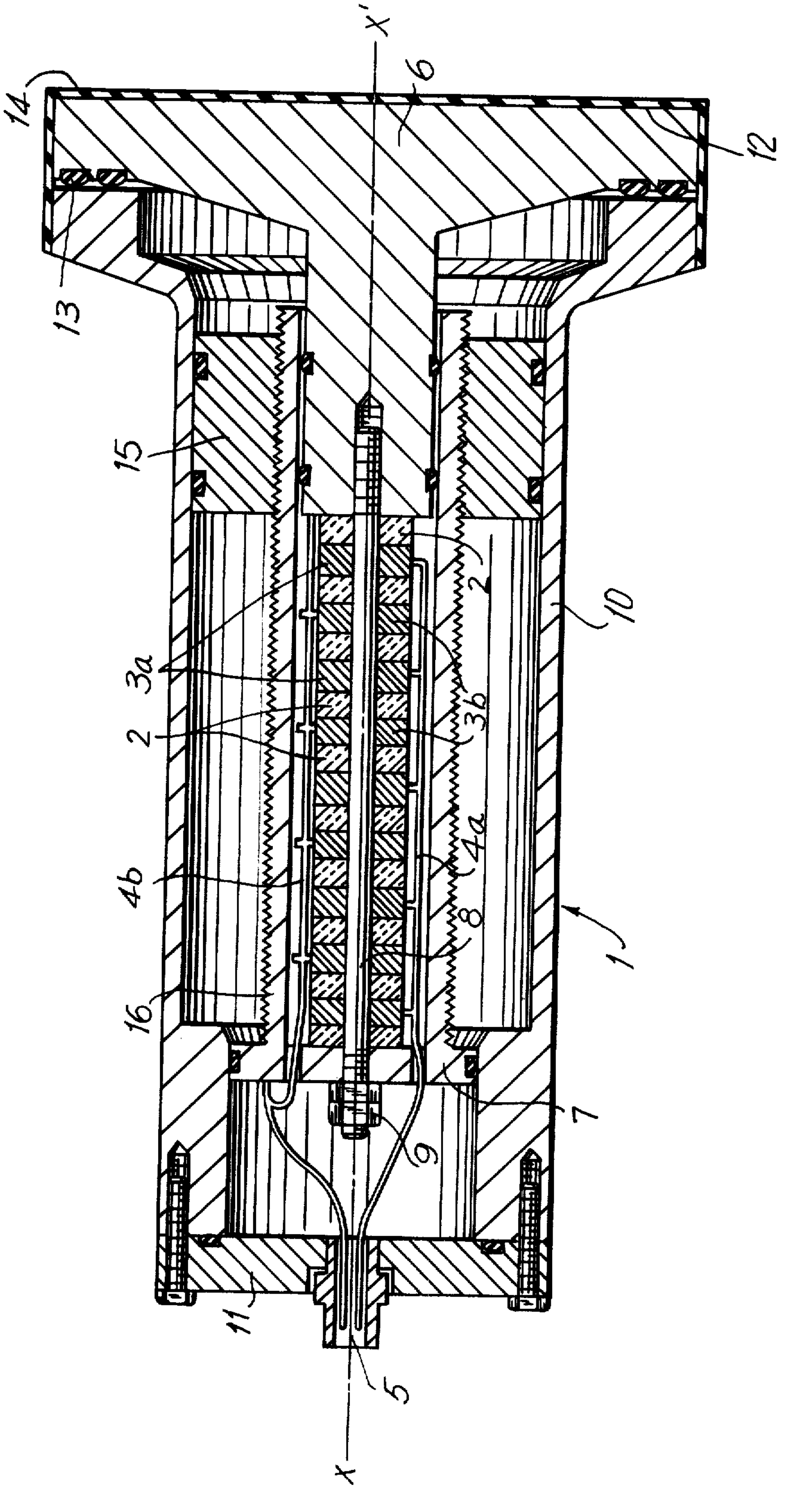
FIG. 1 is a longitudinal sectional view of apparatus according to the invention.

FIG. 1 shows an electro-acoustic transducer derived from the Tonpilz type and designated in entirety by the reference number 1. The transducer is cylindrical and has an axis XX'. The transducer is composed of a stack of piezo-electric elements 2, for example, ceramic elements, alternating with electrodes 3*a* and 3*b* which are connected alternatively to two conductors 4*a* and 4*b* which extend into a cable 5. The piezo-electric elements and the electrodes are maintained in assembled relation between a front receiver plate 6 and a rear plate 7 and the stack of piezo-electric elements and electrodes are compressed by a bolt 8 which is threaded in the receiver plate 6 and on which is threaded a nut 9.

This vibrating assembly is placed in the interior of a casing 10 which is closed in sealed manner at the rear by a cover 11.

The front face 12 of the plate 6 constitutes the bottom of the casing and it emits or receives the acoustic waves. The plate 6 bears against the casing 10 through the intermediary of seals 13 which assure an acoustical decoupling between the plate 6 and the casing.

The front face of the plate 6 is covered by a flexible envelope 14 of a material having the same acoustical impedence as air which therefore transmits the acoustical waves.

Conventionally the rear extremity of the stack, that is to say the extremity remote from the plate 6 is placed in contact with a rigid countermass.

According to the invention, however, the countermass comprises a rigid block 15 in the form of a ring placed around the stack of elements 2,3, and an elastic connection element 16 connects the ring 15 to the rear plate 7. This connection element is constituted, for example, by a metallic tube extending along axis XX' and in the interior of which the stack 2,3 is placed. The tube 16 can be replaced by bolts or by any other equivalent elastic connection means between the block 15 and the rear plate 7.

It is known that the fundamental frequency $F_0$ of a mechanical assembly formed from two masses $M_1$ and $M_2$ connected by an elastic member having a total elasticity e is given by the expression:

$$f_0 = \frac{1}{4\pi^2 e}\left(\frac{1}{M1} + \frac{1}{M2}\right).$$

The presence of connection element 16 having a total elasticity e between the stack and the countermass therefore has the effect of reducing the fundamental frequency and this will be all the more so reduced as the total elasticity or deformability of the elements 16 increases, i.e. the reduction of fundamental frequency is proportional to the reduction of the mechanical stiffness of the element 16.

FIG. 1 shows a preferred embodiment in which the tube 16 is externally threaded and the ring 15 is constituted by a threaded nut on said tube so that by longitudinally displacing the nut the fundamental frequency can be varied without affecting the weight or the total length of the transducer.

By way of example, for a transducer according in FIG. 1 having a fundamental frequency of the order of 1300 Hz and a total length of 30 centimeters, the fundamental frequency can be varied between 1000 Hz and 1500 Hz by displacing the nut 15.

Figure 2:
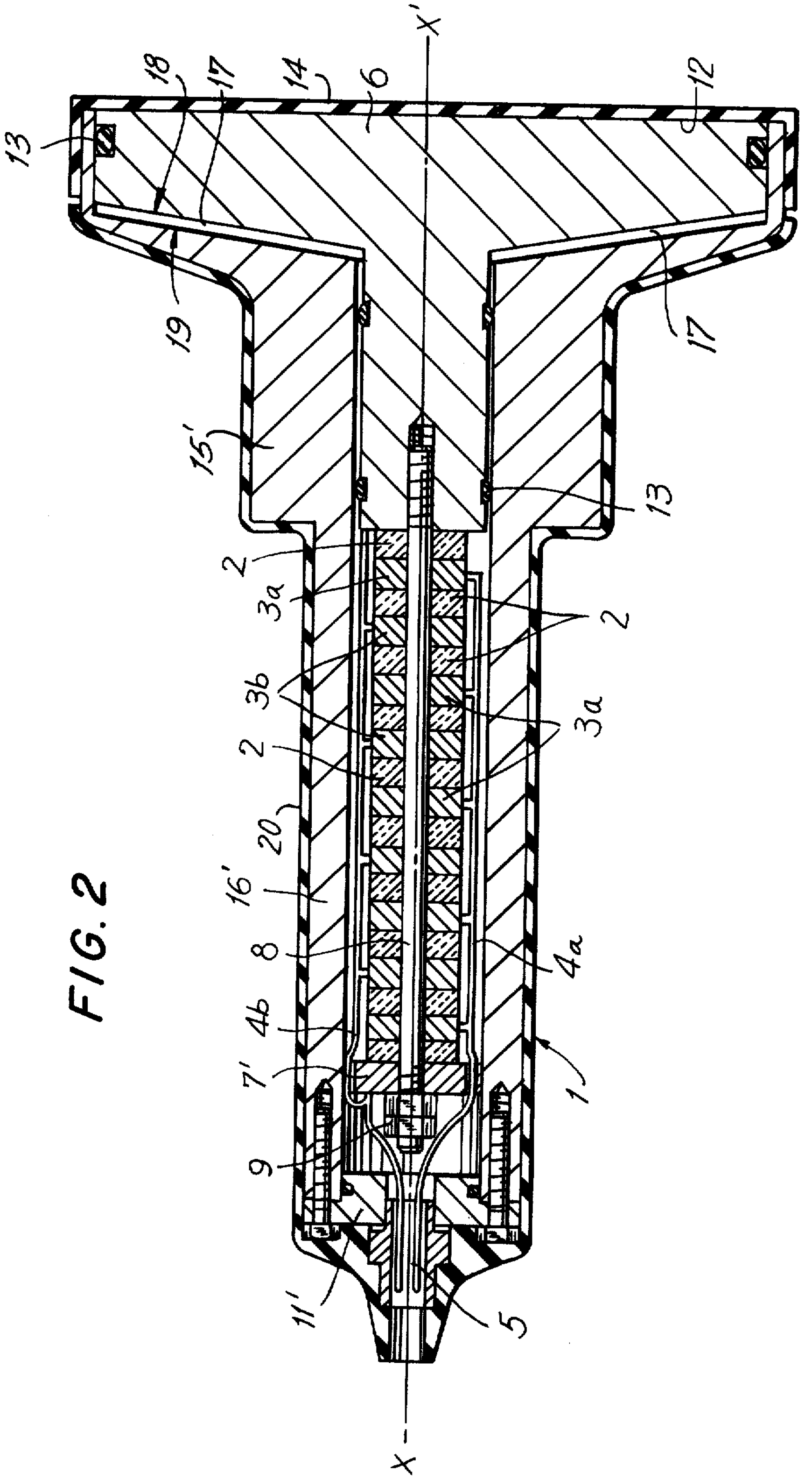
FIG. 2 is a longitudinal sectional view of a second embodiment of the apparatus according to the invention.

FIG. 2 shows a longitudinal section of another transducer in which the same elements are designated by the same reference numerals and modified elements are designated with primes.

In this second embodiment, the countermass is formed by a block 15', a tube 16' and a plate 7' which constitutes a casing resisting the hydrostatic pressure at the interior of which is placed the stack of piezo-electric elements 2 and electrodes 3*a* and 3*b*. This casing is closed at the rear by a sealed cover 11' through which the cable 5 passes.

The bottom of the casing is constituted by the receiver plate 6 which extends into the countermass 15' from which it is separated by the sealed elements 13 which provide acoustical decoupling. The respective lengths of the stack and of the plate 6 on the one hand and the casing on the other are such that there exists a small layer of air 17 separating the rear face of the plate 6 from the face 19 of the countermass. This air layer reduces the transmission or the reception of the acoustical waves through the rear face of the plate 6.

In order to improve the directivity of the apparatus while reducing the emission of waves towards the rear or the reception of waves coming from the rear, there is placed on the casing a deformable envelope 20 of a material absorbant to the acoustical waves or a material having an acoustical impedence very different from that of air.

Figure 3:
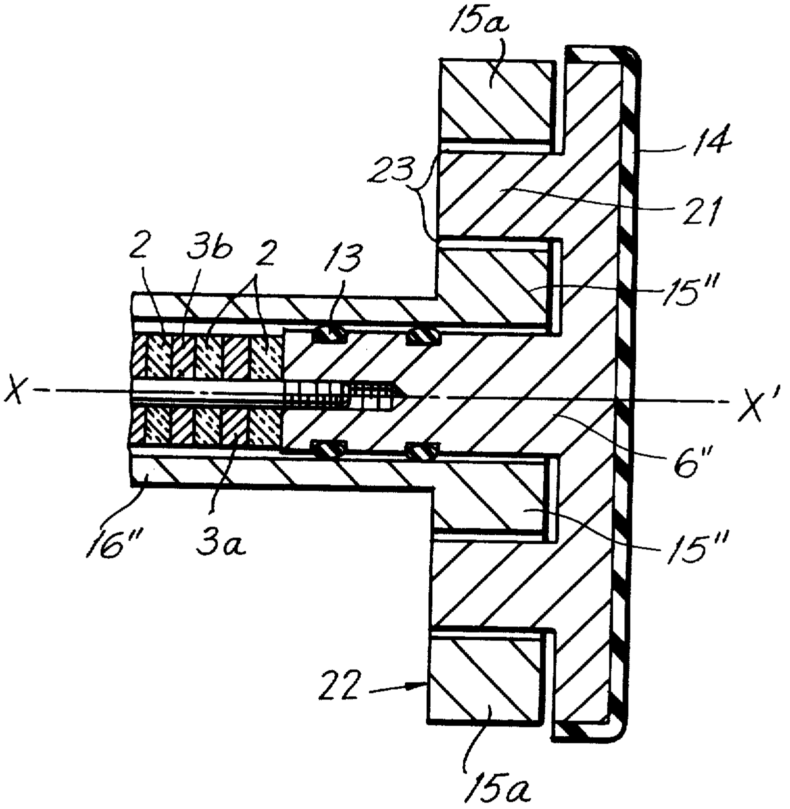
FIG. 3 is a partial sectional view of a third embodiment of apparatus according to the invention.

FIG. 3 shows a partial section of the front extremity of another transducer according to the invention of the same type as before in which countermass 15'' and the tube 16'' constitute a sealed casing. The portions analogous to those of FIGS. 1 and 2 are designated by the same numerals with double primes. The plate 6'' has projections 21 extending towards the rear which engage in hollow recesses situated between parts 15" and 15a of the countermass, which projections are separated from the countermass by a layer of air 23. The projections 21 can be either cylindrical or in the form of a sector centered on axis XX'. This embodiment is particularly adapted to great depths of immersion where the envelope 20 of FIG. 2 loses its efficiency.

The transducer according to FIG. 3 is so constructed that the countermass 15" and the plate 6" vibrate in opposite phase.

They are constructed such that the rear extremities of the projections 21 are situated in the plane 22 of the rear face of the countermass 15" and occupy a substantial portion of the surface of this plane. As a result, the rear radiation from the transducer is very attenuated and a high directivity is obtained even for great depths of immersion.

It is well understood, without departing from the scope of the invention, that diverse equivalent modifications can be made by those skilled in the art to the arrangements that have just been described by way of non-limitative example as defined by the appended claims.

What is claimed is:

1. In a piezo-electric transducer adapted to capture or emit acoustical waves of low frequency including a stack of piezo-electric elements and alternating electrodes, a front receiver plate and a rear countermass, the stack being placed between the front plate and the rear countermass, an improvement wherein said counter mass is placed at least in part at the front of the rear extremity of the stack and therearound, and comprises a rigid annular block mounted around the stack, a rear plate at the rear extremity of the stack, and elastic connection means between said block and said rear plate, said elastic connection means including a tube, the stack being in the interior of said tube.

2. A transducer according to claim 1 wherein said projections have rear surfaces substantially flush with the rear surface of the countermass.

3. A piezo-electric transducer adapted to capture or emit acoustical waves of low frequency comprising a stack of alternating piezo-electric elements and electrodes having a longitudinal axis, a front vibratable plate, and a countermass including a rear plate, a rigid annular block surrounding said stack and a tube connecting said block to said rear plate, said stack being disposed in said tube, and wherein said tube is externally threaded, said annular block being constituted by a threaded nut on said tube such that it can be longitudinally displaced along said tube to vary the fundamental frequency of the transducer.

4. A transducer according to claim 3 wherein said tube and the annular block constitute a casing in which said stack is enclosed, said front plate being secured to said casing to close the same, the transducer further comprising a cover sealingly secured to said casing at the rear extremity thereof.

5. A transducer according to claim 3 comprising a flexible envelope on said casing for acoustical decoupling thereof with the ambient medium.

6. A piezo-electric transducer according to claim 3 wherein said block has hollow recesses extending parallel to said axis, said front plate including rear projections extending parallel to said axis and which extend into said recesses to reduce emission towards the rear.

7. A piezo-electric transducer adapted to capture or emit acoustical waves of low frequency comprising a stack of alternating piezo-electric elements and electrodes having a longitudinal axis, a front vibratable plate, and a countermass including a rear plate, said stack being placed between the front and rear plates, said countermass further including a rigid annular block surrounding said stack, and elastic connection means connecting said block with said rear plate, said elastic connection means extending parallel to said axis and surrounding said stack and including means for varying the distance between said block and said rear plate to vary the fundamental frequency of the transducer.

8. A transducer according to claim 7 wherein said elastic connection means comprises bolts along which said block is displaceable.

* * * * *